United States Patent
Chang et al.

(10) Patent No.: US 10,468,348 B2
(45) Date of Patent: Nov. 5, 2019

(54) METHOD FOR MANUFACTURING INTERCONNECTION

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/891,394

(22) Filed: Feb. 8, 2018

(65) Prior Publication Data
US 2018/0174956 A1    Jun. 21, 2018

Related U.S. Application Data

(62) Division of application No. 15/071,213, filed on Mar. 16, 2016, now Pat. No. 9,899,320.

(60) Provisional application No. 62/291,531, filed on Feb. 5, 2016.

(51) Int. Cl.
| | | |
|---|---|---|
| H01L 21/02 | (2006.01) | |
| H01L 23/528 | (2006.01) | |
| H01L 23/532 | (2006.01) | |
| H01L 29/06 | (2006.01) | |
| H01L 21/768 | (2006.01) | |

(52) U.S. Cl.
CPC ........ *H01L 23/528* (2013.01); *H01L 21/0214* (2013.01); *H01L 21/0217* (2013.01); *H01L 21/7682* (2013.01); *H01L 21/76808* (2013.01); *H01L 21/76816* (2013.01); *H01L 21/76831* (2013.01); *H01L 21/76846* (2013.01); *H01L 21/76883* (2013.01); *H01L 23/53295* (2013.01); *H01L 29/0649* (2013.01); *H01L 2221/1031* (2013.01)

(58) Field of Classification Search
CPC ... H01L 21/02; H01L 21/0217; H01L 21/768; H01L 21/0214; H01L 21/76816; H01L 21/76846; H01L 21/76883; H01L 21/7682; H01L 21/76808; H01L 21/76831; H01L 2221/1031; H01L 27/14636
USPC .......................... 257/774; 438/629, 637, 639
See application file for complete search history.

(56) References Cited

U.S. PATENT DOCUMENTS

| | | | |
|---|---|---|---|
| 2015/0035068 A1* | 2/2015 | Huang | H01L 21/764 257/368 |
| 2016/0380217 A1* | 12/2016 | Afzali-Ardakani | H01L 51/0516 257/347 |
| 2017/0033000 A1* | 2/2017 | Greene | H01L 21/28123 |
| 2017/0110398 A1* | 4/2017 | Chang | H01L 21/76805 |

* cited by examiner

*Primary Examiner* — Chuong A Luu
(74) *Attorney, Agent, or Firm* — JCIPRNET

(57) ABSTRACT

A method for manufacturing an interconnect structure is provided, and the method is as below. A dielectric layer is deposited over a substrate. The dielectric layer is etched to form a recess. A dummy adhesion layer is deposited on sidewalls of the recess. A conductive layer is formed in the recess. The dummy adhesion layer is removed to expose a portion of the conductive layer.

20 Claims, 7 Drawing Sheets

METHOD FOR MANUFACTURING INTERCONNECTION

CROSS-REFERENCE TO RELATED APPLICATION

This is a divisional application of and claims the priority benefit of U.S. application Ser. No. 15/071,213, filed on Mar. 16, 2016, now allowed. The prior U.S. application Ser. No. 15/071,213 claims the priority benefit of U.S. application Ser. No. 62/291,531, filed on Feb. 5, 2016. The entirety of the above-mentioned patent application is hereby incorporated by reference herein and made a part of this specification.

BACKGROUND

The semiconductor integrated circuit (IC) industry has experienced rapid growth. Over the course of this growth, functional density of the devices has generally increased by the device feature size.

In order to meet the requirements for smaller sizes and higher packing densities, electronic devices begin to incorporate a multilayer interconnection structure including interconnections and electrodes with inter-insulating layers disposed therebetween.

DETAILED DESCRIPTION

Figure 1:
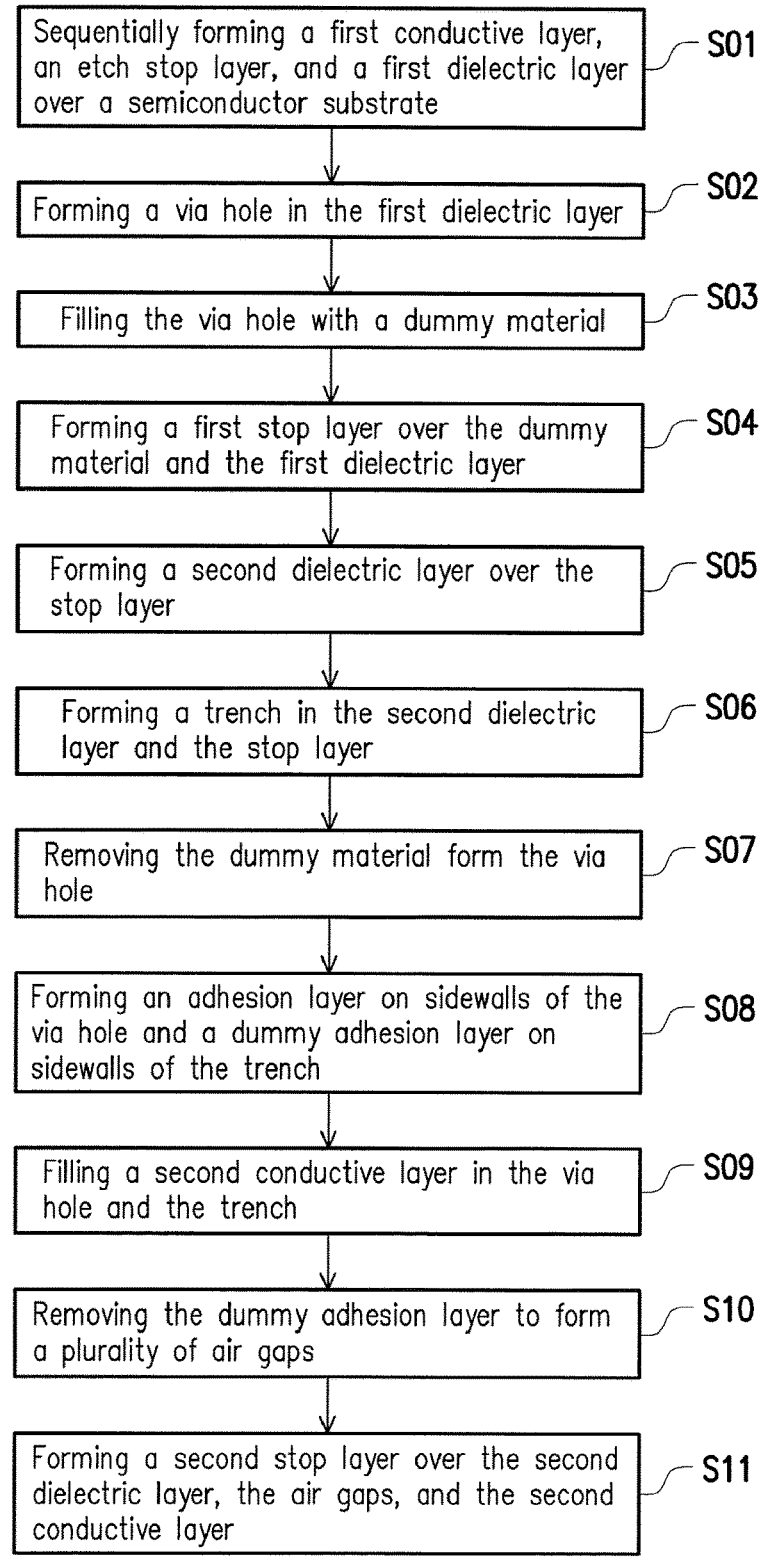
FIG. 1 is a flowchart illustrating a manufacturing method of an interconnection (or referred as interconnect structure) according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
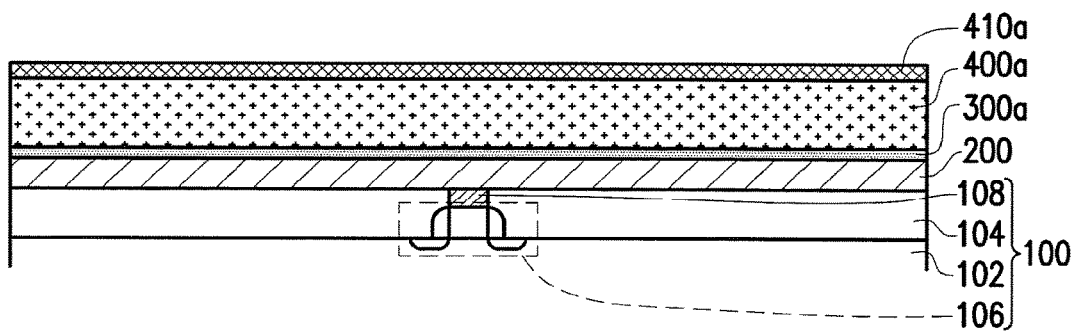
FIG. 2A through FIG. 2O are schematic cross-sectional views illustrating a manufacturing process of an interconnection according to some embodiments of the disclosure.

FIG. 1 is a flowchart illustrating a manufacturing method of an interconnection according to some embodiments of the disclosure. FIG. 2A through FIG. 2O are schematic cross-sectional views illustrating a manufacturing process of an interconnection according to some embodiments of the disclosure.

Referring to FIG. 1 and FIG. 2A, in step S01, a first conductive layer 200, an etch stop layer 300a, and a first dielectric layer 400 are formed over a semiconductor substrate 100 in sequential order. The semiconductor substrate 100 is a substrate as employed in a semiconductor integrated circuit fabrication, and integrated circuits may be formed therein and/or there upon. In some embodiments, the semiconductor substrate 100 is a silicon substrate with or without an epitaxial layer, a silicon-on-insulator substrate containing a buried insulator layer, or a substrate with a silicon germanium layer. In some embodiments, the semiconductor substrate 100 includes a substrate 102, a dielectric layer 104, an active device 106, and a contact 108. The active device 106 is disposed on the substrate 102. In some embodiments, the active device 106 includes a metal-oxide semiconductor (MOS) transistor. In some alternative embodiments, the active device 106 may include fin field effect transistors (FinFET). The dielectric layer 104 is disposed over the substrate 102 and covers the active device 106. In some embodiments, the dielectric layer 104 includes silicon oxide, silicon nitride, silicon oxynitride, or a low dielectric constant (low-k) material with a dielectric constant lower than 4, for example. A method of forming the dielectric layer includes, for example, spin-coating, CVD, a combination thereof, or the like. The first conductive layer 200 is disposed over the semiconductor substrate 100. The first conductive layer 200 includes copper, copper alloys, nickel, aluminum, manganese, magnesium, silver, gold, tungsten, a combination of thereof or the like, for example. Other suitable conductive materials may also be adapted for the first conductive layer 200. The first conductive layer 200 may be formed by, for example, electro-chemical plating process, CVD, Plasma-enhanced chemical vapor deposition (PECVD), atomic layer deposition (ALD), PVD, a combination thereof, or the like. It should be noted that in some embodiments, the dielectric layer 104 includes the contact 108 buried therein to render electrical connection between the first conductive layer 200 and the active device 106 of the semiconductor substrate 100. The contact 108 includes copper, copper alloys, nickel, aluminum, manganese, magnesium, silver, gold, tungsten, a combination of thereof or the like, for example. The contact 108 is formed by, for example, electro-chemical plating process, CVD, plasma-enhanced chemical vapor deposition (PECVD), atomic layer deposition (ALD), physical vapor deposition (PVD), a combination thereof, or the like.

The etch stop layer 300a is formed over the first conductive layer 200 to protect the first conductive layer 200 in the subsequent processes. The etch stop layer 300a includes, for example, silicon carbide, silicon nitride, SiCN, and SiOCN. In some embodiments, the etch stop layer 300a is formed by spin-coating, CVD, PVD, or ALD.

Subsequently, a first dielectric layer 400a is formed over the etch stop layer 300a. In some embodiments, a material of the first dielectric layer 400a is different from the material of the etch stop layer 300a. For example, the first dielectric layer 400a includes a low dielectric constant (low-k) material, a nitride such as silicon nitride, an oxide such as silicon oxide, undoped silicate glass (USG), phosphosilicate glass (PSG), borosilicate glass (BSG), boron-doped phosphosilicate glass (BPSG), or a combination thereof. Specifically, the low-k material has a dielectric constant of less than about 4 or even less than about 3. For example, the first dielectric layer 400a may have a k value of less than about 2.5, and hence is sometimes referred to as an extra low-k (ELK) dielectric layer. In some embodiments, the low-k material includes a polymer based material, such as benzocyclobutene (BCB), FLARE®, or SILK®; or a silicon dioxide based material, such as hydrogen silsesquioxane (HSQ) or SiOF. In some alternative embodiments, the first dielectric layer 400a may be made of tetraethylorthosilicate (TEOS) materials. Furthermore, in some embodiments, the first dielectric layer 400a may include multiple dielectric materials. The formation method of the first dielectric layer 400a includes, for example, spin-coating, CVD, and ALD.

In some embodiments, a first hard mask layer 410a is further formed over the first dielectric layer 400a. The first hard mask layer 410a may be formed of metallic materials, such as Ti, TiN, Ta, TaN, Al, and the like. In some other embodiments adapting non-metal hard mask scheme, non-metallic materials such as $SiO_2$, SiC, SiN, and SiON may be used. The first hard mask layer 410a may be formed by, for example, electro-chemical plating process, CVD, plasma-enhanced chemical vapor deposition (PECVD), atomic layer deposition (ALD), PVD, a combination thereof, or the like. Further, in some alternative embodiments, an antireflection layer (not illustrated) is first formed on the first dielectric layer 400a. Subsequently, the first hard mask layer 410a is then formed on the antireflection layer. The antireflection layer may be referred to as a bottom anti-reflective coating (BARC). The antireflection layer is a nitrogen-free anti-reflective coating (NFARC) layer. In detail, the NFARC layer includes materials containing, for example, carbon and oxygen.

Figure 2B:
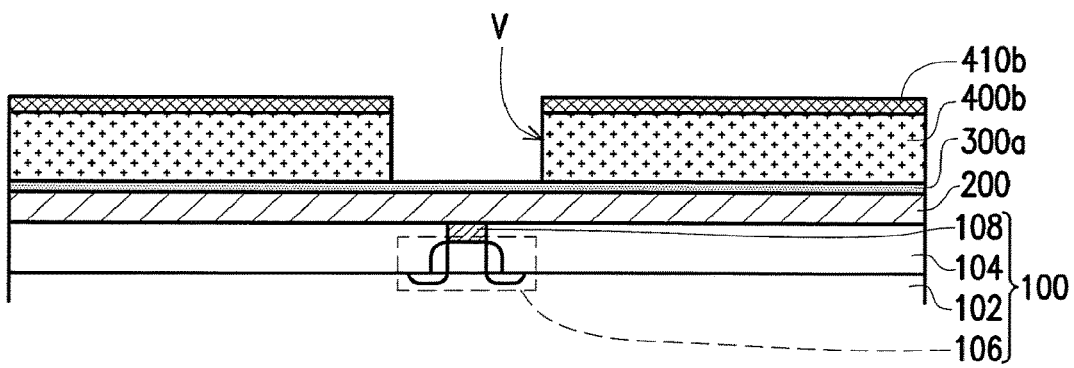

Referring to FIG. 1 and FIG. 2B, in step S02, a photolithographic and etching process is performed on the first hard mask layer 410a so that a patterned first hard mask layer 410b is formed. Subsequently, with the aid of the patterned first hard mask layer 410b as a mask, the first dielectric layer 400a is being etched to render a first dielectric layer 400b including a via hole V formed therein.

Figure 2C:
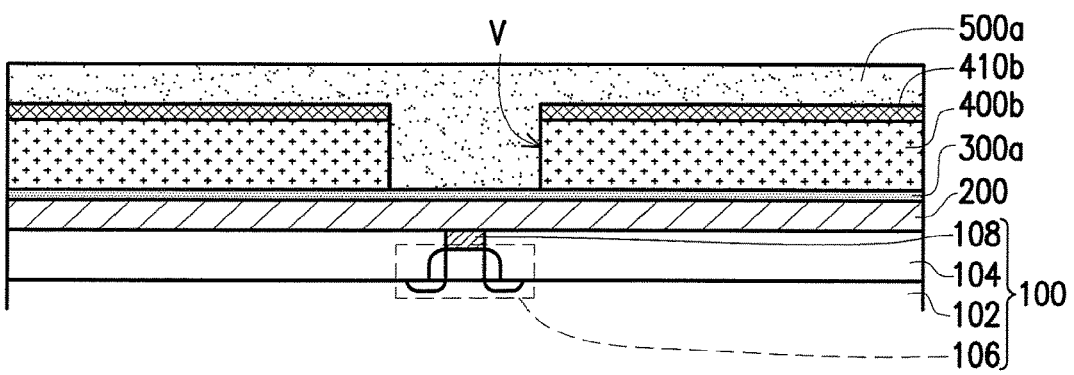
Figure 2D:
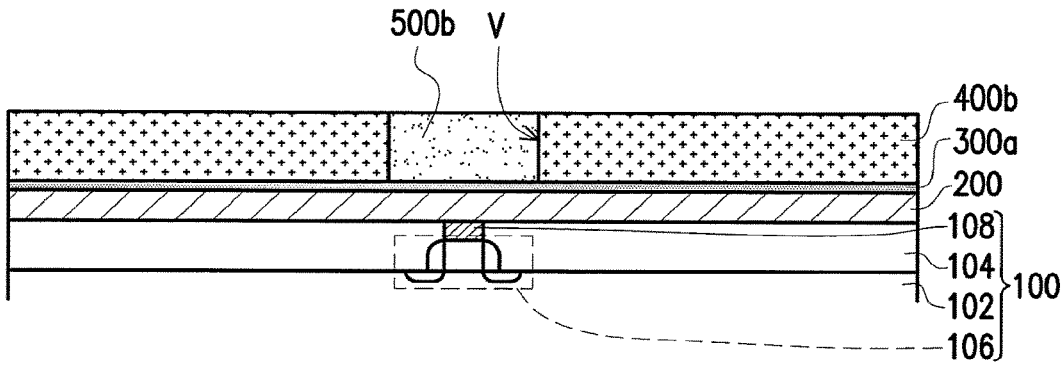

Referring to FIG. 1 and FIG. 2D, in step S03, a dummy material 500b is filled into the via hole V. In some embodiments, the dummy material 500b may include a plug substantially filling the via hole V. Alternatively, in some other embodiments, the dummy material 500b may include a liner located substantially over the bottom and sidewalls of the via hole V. In detail, as illustrated in FIG. 2C, dummy material 500a is disposed over the first hard mask layer 410a and is filled into the via hole V. The dummy material 500a may include one or more layers made of photoresist materials, polymer materials, or dielectric materials. In some embodiments, a material of the dummy material 500a and the material of the first dielectric layer 400b are different. For example, the dummy material 500a includes silicon, polysilicon, silicon dioxide (SiO2), tetraethylorthosilicate (TEOS) oxide, silicon nitride (SixNy; x and y are greater than 0), borophosphosilicate glass (BPSG), fluoride-doped silicate glass (FSG), low-k dielectric, and/or other suitable materials. The dummy material 500a may be formed, for example, by selective epitaxial growth (SEG), CVD, PECVD, ALD, PVD, electrophoresis, spin-on coating, or other suitable processes. Subsequent to the deposition of the dummy material 500a, part of the dummy material 500a and the first hard mask layer 410b are removed so as to render the dummy material 500b located solely in the via hole V, as illustrated in FIG. 2D. The method for removing the excessive dummy material includes, for example, etching, chemical mechanical polishing (CMP), or other suitable polishing methods.

Figure 2E:
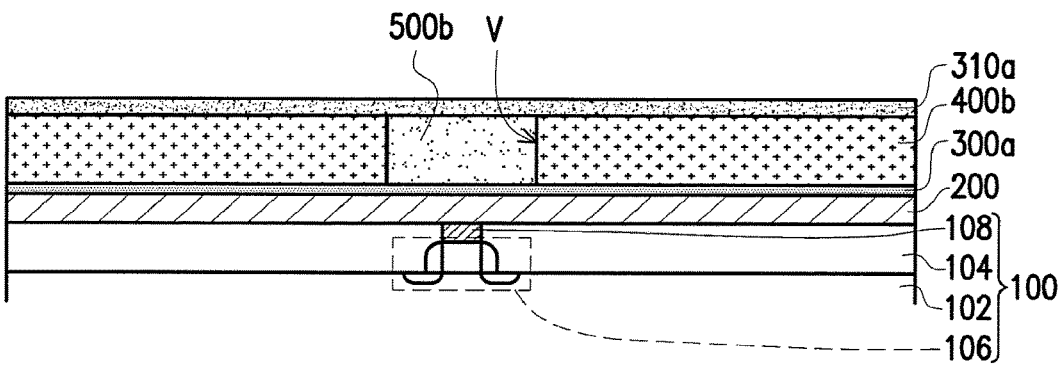

Referring to FIG. 1 and FIG. 2E, in step S04, a first stop layer 310a is formed over the dummy material 500b and the first dielectric layer 400b. A material of the first stop layer 310a may be the same as or different from the material of the etch stop layer 300a. For example, the first stop layer 310a includes silicon carbide, silicon nitride, SiCN, SiOCN, and other suitable material in some embodiments. In some embodiments, the first stop layer 310a may be formed by spin-coating, CVD, PVD, and ALD. Similar to that of the etch stop layer 300a, the first stop layer 310a may also serve the function of protecting the first dielectric layer 400b and the dummy material 500b from the subsequent processes.

Figure 2F:
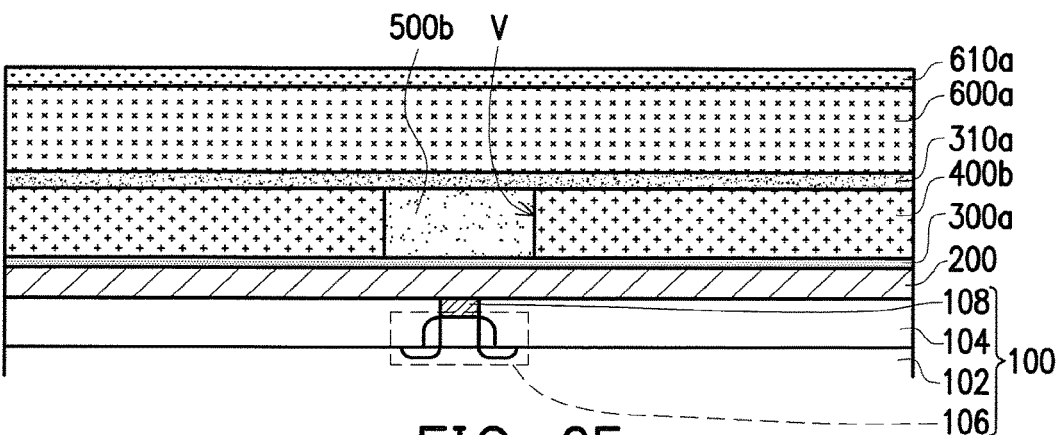

Referring to FIG. 1 and FIG. 2F, in step S05, in some embodiments, a second dielectric layer 600a is formed over the first stop layer 310a. A material of the second dielectric layer 600a is identical as the material of the first dielectric layer 400b. In alternative embodiments, the material of the second dielectric layer 600a is different from the material of the first dielectric layer 400b and is different from the material of the first stop layer 310a. Therefore, in some embodiments, the second dielectric layer 600a includes a low dielectric constant (low-k) material, an extra low-k (ELK) material, a nitride such as silicon nitride, an oxide such as silicon oxide, undoped silicate glass (USG), phosphosilicate glass (PSG), borosilicate glass (BSG), boron-doped phosphosilicate glass (BPSG), tetraethylorthosilicate (TEOS), or a combination thereof. Similar to that of the first dielectric layer 400b, the second dielectric layer 600a may also include multiple dielectric materials. The formation method of the second dielectric layer 600a includes, for example, spin-coating, CVD, PVD, and ALD.

In some alternative embodiments, a second mask layer 610a is further formed over the second dielectric layer 600a. The second mask layer 610a may adapt the same material or different material as compared to the first hard mask layer 410a. For example, in some embodiments, the second hard mask layer 610a may be formed of metallic materials, such as Ti, TiN, Ta, TaN, Al, and the like. In some other embodiments adapting non-metal hard mask scheme, non-metallic materials such as $SiO_2$, SiC, SiN, and SiON may be used. The second hard mask layer 610a may be formed by, for example, electro-chemical plating process, CVD, plasma-enhanced chemical vapor deposition (PECVD), atomic layer deposition (ALD), PVD, a combination thereof, or the like. Further, in some alternative embodiments, an antireflection layer is first formed on the second dielectric layer 600a. Subsequently, the second hard mask layer 610a is then formed on the antireflection layer. The antireflection layer may be referred to as a bottom anti-reflective coating (BARC). The antireflection layer is a nitrogen-free anti-reflective coating (NFARC) layer. In detail, the NFARC layer includes materials containing, for example, carbon and oxygen.

Figure 2G:
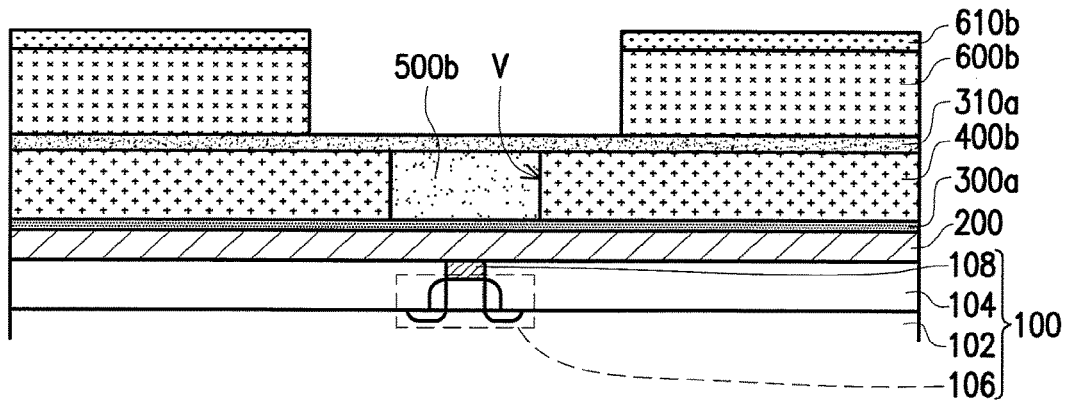
Figure 2H:
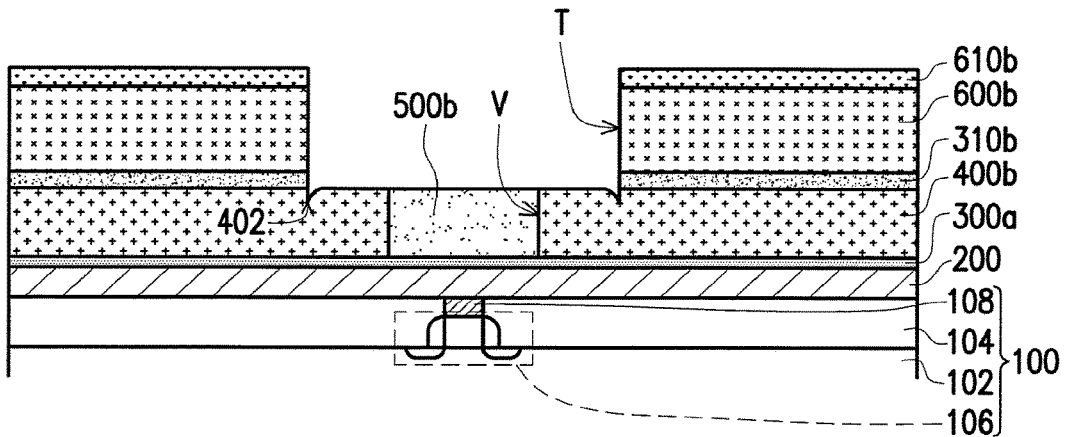

Referring to FIG. 1 and FIG. 2G, in step S06, a photolithographic and etching process is performed to form a patterned second hard mask layer 610a. Subsequently, with the aid of the patterned second hard mask layer 610b as a mask and the first stop layer 310a as an etching stop layer, the second dielectric layer 600a is being etched to render the second dielectric layer 600b. Referring to FIG. 2H, subsequently, the first stop layer 310a exposed by the second dielectric layer 600b is etched to complete the formation of a trench T. In some embodiments, the trench T exposes part of the first dielectric layer 400b and the dummy material 500b. Depending on the materials of the second dielectric layer 600a and the first stop layer 310a, the etching of the second dielectric layer 600a and the first stop layer 310a may be conducted by a same etchant or different etchants. That is, the etching of the second dielectric layer 600a and the first stop layer 310a (as illustrated in FIG. 2G and FIG. 2H) may be performed by a single process or multiple processes. Since the first stop layer 310a is a thin layer while a high etching selectivity ratio of the first stop layer 310a to the second dielectric layer 600b can be achieved by the selection of the etchant, the trench T has a planar bottom surface. In some embodiments, the trench T has a planar bottom surface and only a small tiger teeth-like recess 402 is formed on the sidewalls of the trench T which extends into a portion of the first dielectric layer 400b, as illustrated in FIG. 2H.

Figure 2I:
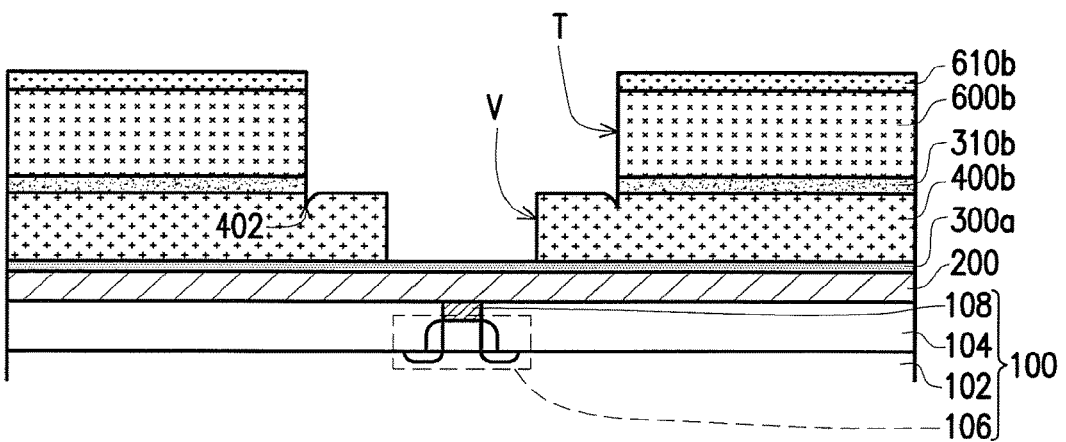

Referring to FIG. 1 and FIG. 2I, in step S07, the dummy material 500b is removed from the via hole V. The dummy material 500b may be removed by plasma etch, chemical etch, thermal burn-out, and/or other suitable processes. For example, the dummy material 500b may be removed by an oxygen-containing plasma environment. The dummy material 500b may also be removed by a plasma environment which may include reactant gases such as hydrochloric acid (HCl), hydrogen bromide (HBr), sulfur dioxide ($SO_2$), chlorine ($Cl_2$), sulfur hexafluoride ($SF_6$), perfluorocarbons, and/or other reactants. Alternatively, the dummy material 500b may be removed by chemical etch which may include phosphoric acid ($H_3PO_4$), ammonium hydroxide ($NH_4OH$), hydrochloric acid (HCl), hydrofluoric acid (HF), sulfuric acid ($H_2SO_4$), hydrogen peroxide ($H_2O_2$), de-ionized water, and/or other chemicals. As illustrated in FIG. 2I, the trench T constitute a larger opening as compared to the via hole V. Alternatively speaking, a width of the trench T is larger than a width of the via hole V. The trench T and the via V are in spatial communication with each other. In other word, the trench T and the via hole V form an recess in the first dielectric layer 400b, the first stop layer 310b and the second dielectric layer 600b.

Figure 2J:
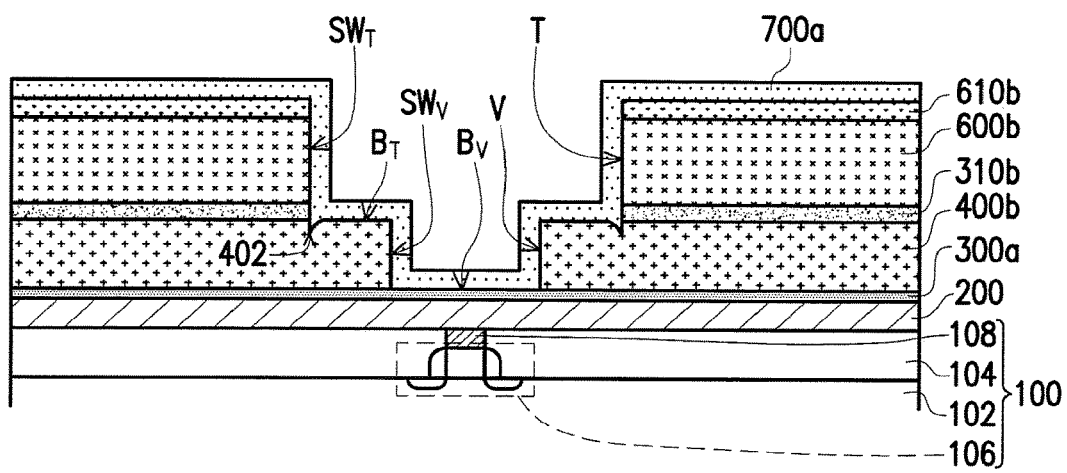
Figure 2K:
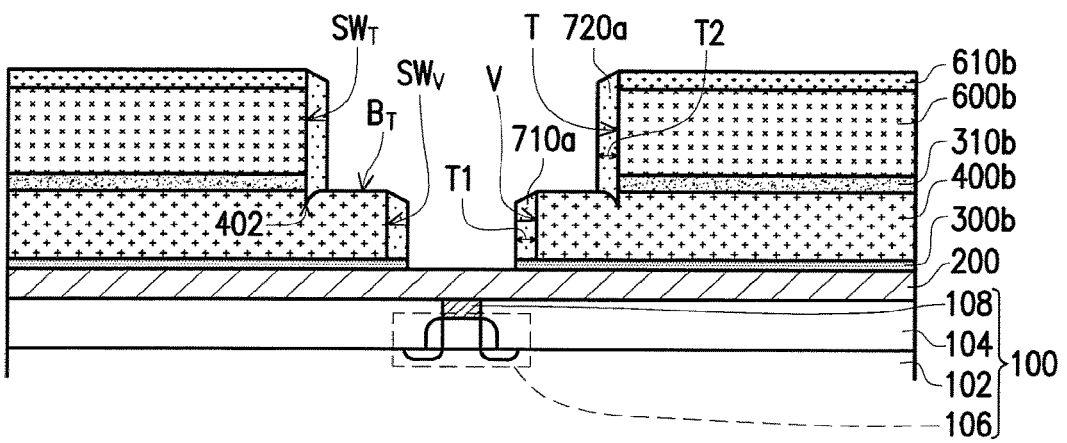
Figure 2L:
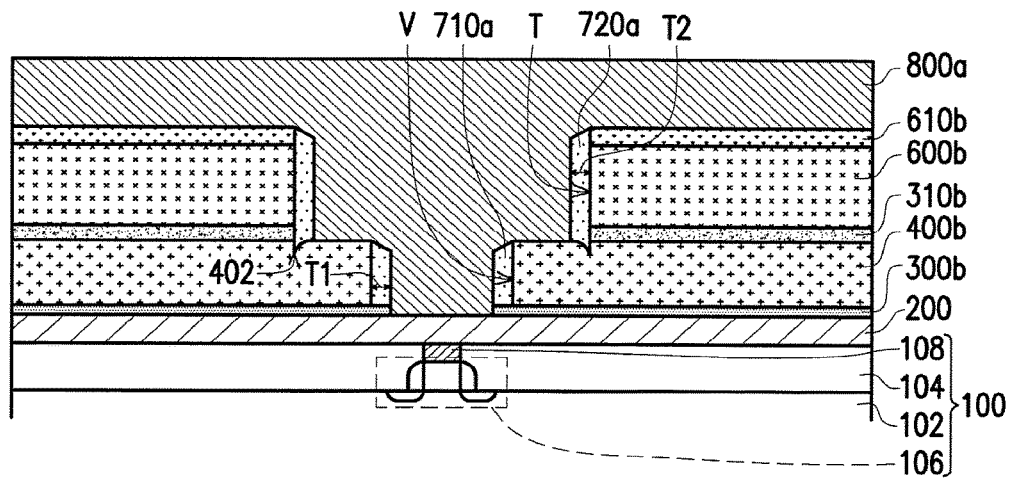

Referring to FIG. 1 and FIG. 2K, in step S08, an adhesion layer 710a is formed on sidewalls $SW_V$ of the via hole V and a dummy adhesion layer 720a is formed on sidewalls $SW_T$ of the trench T and filled in the tiger teeth-like recess 402. In some embodiments, a thickness T2 of the dummy adhesion layer 720a is greater than a width of the tiger teeth-like recess 402. Specifically, referring to FIG. 2J, an adhesion material layer 700a is formed over the second hard mask layer 610b, in the trench T, in the via hole V, and in the small tiger teeth-like recess 402. The adhesion material layer 700a covers the sidewalls $SW_T$ and bottom $B_T$ of the trench and sidewalls $SW_V$ and bottom $B_V$ of the via hole V. In some embodiments, a material of the adhesion material layer 700a is different from the material of the first dielectric layer 400b and is different from the material of the second dielectric layer 600b. On the other hand, in some embodiments, the material of the adhesion material layer 700a is the same as the material of the first stop layer 310b. In some alternative embodiments, the material of the adhesion material layer 700a is different from the material of the first stop layer 310b. Specifically, in some embodiments, the material of the adhesion material layer 700a includes insulating materials, and the adhesion material layer 700a is also referred as an insulating material layer. For example, the insulating materials for the adhesion material layer 700a include SiN, SiON, SiCON, other suitable materials, or combinations thereof. The method for forming the adhesion material layer 700a includes CVD, PVD, and ALD, for example. Subsequently, an etching process is performed on the adhesion material layer 700a (or referred as insulating material layer) to form an insulating layer on sidewalls of the via hole V and on sidewalls of the trench T. In some embodiments, an anisotropic etching process is performed on the adhesion material layer 700a to render the adhesion layer (or referred as insulating layer) 710a located on sidewalls $SW_V$ of the via hole V and the dummy adhesion layer (or referred as insulating layer) 720a located on sidewalls $SW_T$ of the trench T simultaneously. In other words, the adhesion layer 710a and the dummy adhesion layer 720a are formed by the same process and thus belong to the same layer. Therefore, a thickness T1 of the adhesion layer 710a is substantially equal to the thickness T2 of the dummy adhesion layer 720a. Subsequent to the formation of the adhesion layer 710a and the dummy adhesion layer 720a, the etch stop layer 300a exposed by the via hole V is removed to render etch stop layer 300b. In other words, the adhesion layer 710a and the etch stop layer 300b exposes the first conductive layer 200 for electrical connection in the subsequent processes. In some embodiments, the adhesion material layer 700a is formed by ALD so as to provide a good via critical dimension control. As such, the via and trench process window may be enlarged while the electrical property of the semiconductor device may be enhanced.

Figure 2M:
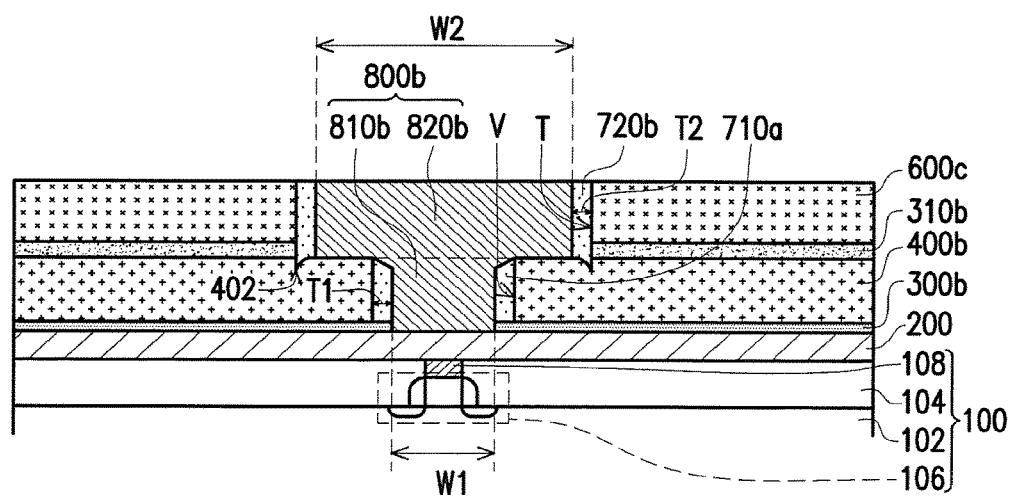

Referring to FIG. 1 and FIG. 2M, in step S09, a second conductive layer 800b is filled into the trench T and the via hole V to electrically connect with the first conductive layer 200. In some embodiments, since the thickness T2 of the dummy adhesion layer 720b is greater than the width of the small tiger teeth-like recess 402, the second conductive layer 800b is not filled into the small tiger teeth-like recess 402.

Referring to FIG. 2L, in detail, a second conductive material 800a is formed over the second hard mask layer 610b and is filled into the trench T and the via hole V. A material of the second conductive material 800a may be the same as or different from the material of the first conductive layer 200. For example, the second conductive material 800a may include copper, copper alloys, nickel, aluminum, manganese, magnesium, silver, gold, tungsten, a combination of thereof or the like. Similar to that of the first conductive layer 200, the second conductive material 800a may be formed by, for example, electro-chemical plating process, CVD, PECVD, ALD, PVD, a combination thereof, or the like. Referring to FIG. 2L and FIG. 2M, a portion of the second conductive material 800a, the second hard mask layer 610b, a portion of the dummy adhesion layer 720a, and a portion of the second dielectric layer 600b are removed to form the second conductive layer 800b located in the trench T and the via hole V, a dummy adhesion layer 720b, and a second dielectric layer 600c. The removing process may be achieved by chemical etching, CMP, or other suitable processes. In some embodiments, a barrier layer or a glue layer (not illustrated) may be formed between the second conductive layer 800b and the adhesion layer 710a and between the second conductive layer 800b and the dummy adhesion layer 720b to prevent the migration of the material of the second conductive layer 800b to the adhesion layer 710a, the dummy adhesion layer 720b, the first dielectric layer 400b, and the second dielectric layer 600c. In some embodiments, a material of the barrier layer includes tantalum, tantalum nitride, titanium, titanium nitride, cobalt-tungsten (CoW) or a combination thereof. Other materials listed above may be used for the barrier layer or the glue layer depending on the material of the second conductive layer 800b. In some embodiments, the second conductive layer 800b may be divided into a first conductive portion 810b and a second conductive portion 820b. The first conductive portion 810b is located in the via hole V and the second conductive portion 820b is located in the trench T. As mentioned above, a width of the trench T is greater than a width of the via hole V, and thus a width W2 of the second conductive portion 820b is greater than a width W1 of the first conductive portion 810b. In some embodiments, the first conductive portion 810b constitute a via and the second conductive portion 820b constitute a conductive line. For example, the via extends along a vertical direction while the conductive line extends along a horizontal direction.

Figure 2N:
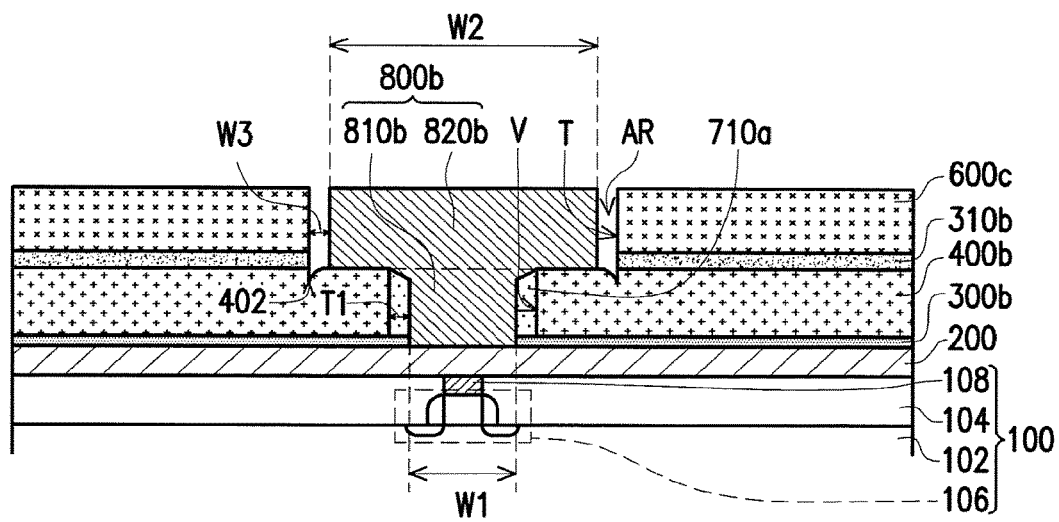
Figure 2O:
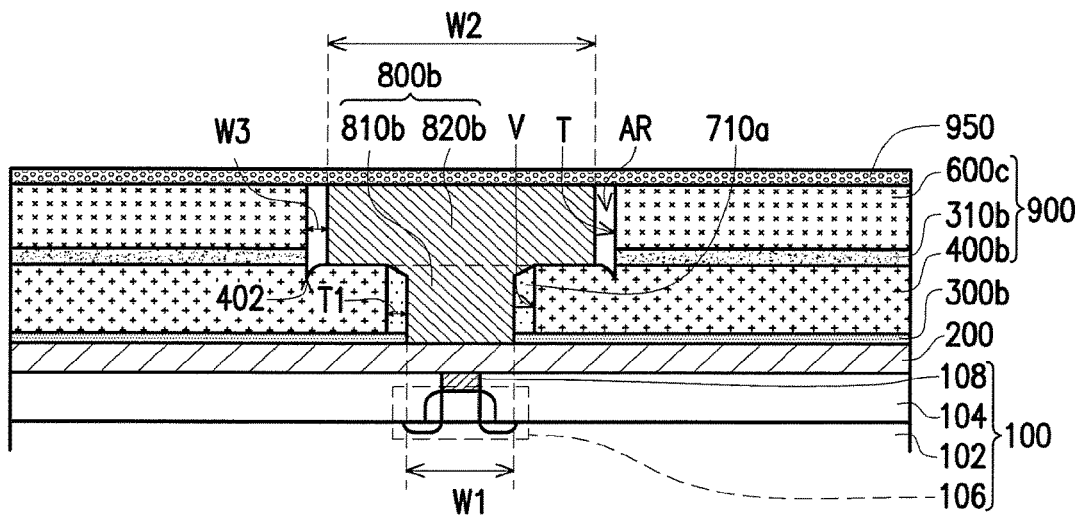

Referring to FIG. 1 and FIG. 2N, in step S10, the dummy adhesion layer 720b is removed to form a plurality of air gaps AR. The air gaps AR are located on sidewalls $SW_T$ of the trench T. Specifically, the air gaps AR are located between the second conductive portion 820b of the second conductive layer 800b and the second dielectric layer 600c along with the first stop layer 310b. On the other hand, the adhesion layer 710a is located between the first conductive portion 810b of the second conductive layer 800b and the first dielectric layer 400b. In some embodiments, the dummy adhesion layer 720b may be removed by plasma etch, chemical etch, thermal burn-out, and/or other suitable processes. Each of the air gaps AR has a width W3 that is substantially the same as the thickness T2 of the dummy adhesion layer 720a (shown in FIG. 2K). In other words, the widths W3 of the air gaps AR are substantially the same as the thickness T1 of the adhesion layer 710a, for example. In some embodiments, the air gaps AR further extend into a portion of the first dielectric layer 400b. In other words, a bottom of the air gaps AR has a tiger teeth-like profile, for example. The air gaps AR has a dielectric constant k of roughly 1 and is able to lower the parasitic capacitance of the semiconductor device.

Referring to FIG. 1 and FIG. 2O, in step S11, a second stop layer 950 is formed over the second dielectric layer 600c, the air gaps AR, and the second conductive layer 800b to seal the air gaps AR and to render an interconnection 10. A material of the second stop layer 950 may be the same as or different from the material of the etch stop layer 300b and the first stop layer 310b. For example, the second stop layer 950 includes silicon carbide, silicon nitride, SiCN, SiOCN, and other suitable material in some embodiments. Other than sealing the air gaps AR, the second stop layer 950 may also serve the function of protecting the second dielectric layer 600c and the second conductive layer 800b from the subsequent processes. The formation method of the second stop layer 950 includes, for example, spin-coating, CVD, PVD, and ALD.

Alternatively, in some embodiments, the first dielectric layer 400b and the second dielectric layer 600c may be viewed as a single dielectric layer 900. In other words, the first stop layer 310b is buried in the dielectric layer 900, and the second conductive layer 800b penetrates through the dielectric layer 900. Moreover, in some embodiments, the adhesion layer 710a may be referred to as an insulating layer due to its electrical insulating property. Referring to FIG. 2N, the adhesion layer 710a (the insulating layer) is located between a portion of the dielectric layer 900 and the first conductive portion 810b of the second conductive layer 800b. On the other hand, the air gaps AR are located between another portion of the dielectric layer 900 and the second conductive portion 820b of the second conductive layer 800b. That is, the second conductive layer 800b is separated from the dielectric layer 900 by the air gaps AR.

Referring to FIG. 1 and FIG. 2O, in the present disclosure, since the via hole V is formed first and the trench T is then formed, by adapting the first stop layer 310a with a small thickness (a thin layer) and a specific selection of the etchant (a high etching selectivity ratio of the first stop layer 310a to the first dielectric layer 400b), the loading effect of the device may be reduced. Moreover, as mentioned above, in the interconnection 10, the trench T has a substantially planar bottom surface. Even though the small tiger teeth-like recess 402 are located on sidewalls $SW_T$ of the trench T, the size thereof is small enough to be neglected. As a matter of fact, since the tiger teeth-like recess 402 is occupied by the air gap AR, the parasitic capacitance of the semiconductor device may be reduced, thereby increasing the operating speed of the device. Further, since an adhesion material layer 700a is formed after the formation of the via hole V and the trench T, the process window for the via hole V and the trench T may be enlarged. Consequently, the tuning of the device may be easily achieved, the electrical property of the semiconductor device may be improved, and the yield of the semiconductor device may be enhanced.

The present disclosure is not limited to applications in which the semiconductor device includes MOSFETs or FinFETs, and may be extended to other integrated circuit having a dynamic random access memory (DRAM) cell, a single electron transistor (SET), and/or other microelectronic devices (collectively referred to herein as microelectronic devices).

In accordance with some embodiments of the present disclosure, a manufacturing method of an interconnect structure is as below. A dielectric layer is deposited over a substrate. The dielectric layer is etched to form a recess. A dummy adhesion layer is deposited on sidewalls of the recess. A conductive layer is formed in the recess. The dummy adhesion layer is removed to expose a portion of the conductive layer.

In accordance with alternative embodiments of the present disclosure, a manufacturing method of an interconnect structure is as below. A dielectric layer is deposited on a conductive layer, wherein the dielectric layer comprises a stop layer formed therein. A portion of the dielectric layer is removed to form a first recess and a second recess over the first recess. An insulating material layer is deposited on the dielectric layer to cover sidewalls and a bottom surface of the second recess and sidewalls and a bottom surface of the first recess. An anisotropic etching process is performed on the insulating material layer to form an insulating layer extending along a first direction. The first recess and the second recess are filled with a conductive material. A portion of the insulating layer on the sidewalls of the second recess is removed to form an air gap between the conductive material and the dielectric layer.

In accordance with yet alternative embodiments of the present disclosure, a manufacturing method of an interconnect structure is as below. A first conductive layer and a first dielectric layer are sequentially formed over a semiconductor substrate. A via hole is formed in the first dielectric layer. A dummy material is filled into the via hole. A first stop layer and a second dielectric layer are sequentially formed over the first dielectric layer and the dummy material. A trench is formed in the second dielectric layer and the first stop layer. The dummy material is removed from the via hole. An adhesion layer is formed on sidewalls of the via hole and a dummy adhesion layer is formed on sidewalls of the trench. A second conductive layer is filled in the via hole and the trench to electrically connect to the first conductive layer. The dummy adhesion layer is removed to form a plurality of air gaps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an interconnect structure, comprising:
    depositing a dielectric layer over a substrate;
    etching the dielectric layer to form a recess;
    depositing an adhesion layer on a first portion of sidewalls of the recess, and a dummy adhesion layer on a second portion of the sidewalls of the recess;
    forming a conductive layer in the recess; and
    removing the dummy adhesion layer to expose a portion of the conductive layer and form an air gap between the conductive layer and the dielectric layer,
    wherein the adhesion layer is separated from the air gap by the dielectric layer.

2. The method for manufacturing the interconnect structure according to claim 1, wherein the etching the dielectric layer comprises forming a trench, and the forming the conductive layer comprises forming a conductive line in the trench.

3. The method for manufacturing the interconnect structure according to claim 2, wherein the etching the dielectric layer further comprises forming a via hole, and the forming the conductive layer further comprises forming a via in the via hole.

4. The method for manufacturing the interconnect structure according to claim 3, wherein the dummy adhesion layer is deposited on sidewalls of the trench, and the adhesion layer is deposited on sidewalls of the via hole.

5. The method for manufacturing the interconnect structure according to claim 4, wherein the adhesion layer and the dummy adhesion layer are formed continuously.

6. The method for manufacturing the interconnect structure according to claim 5, further comprises:
    performing an etching process to separate the adhesion layer from the dummy adhesion layer.

7. The method for manufacturing the interconnect structure according to claim 6, wherein the adhesion layer and the dummy adhesion layer include an insulating material layer.

8. The method for manufacturing the interconnect structure according to claim 7, wherein the insulating material layer comprises SiN, SiON, SiCON, or combinations thereof.

9. A method for manufacturing an interconnect structure, comprising:
    depositing a dielectric layer on a conductive layer, wherein the dielectric layer comprises a stop layer formed therein;
    removing a portion of the dielectric layer to form a first recess and a second recess over the first recess;
    depositing an insulating material layer on the dielectric layer to cover sidewalls and a bottom surface of the second recess and sidewalls and a bottom surface of the first recess;
    performing an anisotropic etching process on the insulating material layer to form an insulating layer extending along a first direction;
    filling the first recess and the second recess with a conductive material;
    removing a portion of the insulating layer on the sidewalls of the second recess to form an air gap between the conductive material and the dielectric layer.

10. The method for manufacturing the interconnect structure according to claim 9, wherein
    the depositing the dielectric layer comprises depositing a first dielectric layer and a second dielectric layer on the first dielectric layer; and
    the first recess is formed in the first dielectric layer, and the second recess is formed in the second dielectric layer.

11. The method for manufacturing the interconnect structure according to claim 10, wherein the stop layer is formed after depositing the first dielectric layer and before depositing the second dielectric layer, and the second recess is further formed in the stop layer.

12. The method for manufacturing the interconnect structure according to claim 11, wherein the forming the second recess in the second dielectric layer uses the stop layer as an etch stop layer.

13. The method for manufacturing the interconnect structure according to claim 11, wherein
    the air gap is formed between the conductive material and the second dielectric layer, and between the conductive material and the stop layer; and
    the air gap is separated from the insulating layer remained on the sidewalls of the first recess by the first dielectric layer.

14. A method for manufacturing an interconnect structure, comprising:
    sequentially forming a first conductive layer and a first dielectric layer over a semiconductor substrate;
    forming a via hole in the first dielectric layer;
    filling a dummy material into the via hole;
    sequentially forming a first stop layer and a second dielectric layer over the first dielectric layer and the dummy material;
    forming a trench in the second dielectric layer and the first stop layer;
    removing the dummy material from the via hole;
    forming an adhesion layer on sidewalls of the via hole and a dummy adhesion layer on sidewalls of the trench;
    filling a second conductive layer in the via hole and the trench to electrically connect to the first conductive layer; and
    removing the dummy adhesion layer so as to form a plurality of air gaps.

15. The method for manufacturing the interconnect structure according to claim 14, where the forming the trench further comprises forming a tiger teeth-like recess on sidewalls of the trench, and the plurality of air gaps are formed to have tiger teeth-like profiles.

16. The method for manufacturing the interconnect structure according to claim 14, wherein a material of the dummy material and a material of the first dielectric layer are different.

17. The method for manufacturing the interconnect structure according to claim 14, wherein the forming the adhesion layer and the forming the dummy adhesion layer comprises:
    forming an adhesion material layer to cover sidewalls and bottom of the trench and sidewalls and bottom of the via; and performing an anisotropic etching process on the adhesion material layer so as to form the adhesion layer and the dummy adhesion layer simultaneously.

18. The method for manufacturing the interconnect structure according to claim 14, wherein the forming the trench in the second dielectric layer and the first stop layer comprises:
    patterning the second dielectric layer; and
    removing the first stop layer exposed by the patterned second dielectric layer to form the trench.

19. The method for manufacturing the interconnect structure according to claim 14, further comprising:
    forming an etch stop layer on the semiconductor substrate before forming the first dielectric layer; and
    removing the etch stop layer exposed by the via hole before the filling the second conductive layer.

20. The method for manufacturing the interconnect structure according to claim 14, further comprising:
    forming a second stop layer over the second dielectric layer, the air gaps, and the second conductive layer to seal the air gaps.

* * * * *